(12) United States Patent
Lulla et al.

(10) Patent No.: US 6,990,618 B1
(45) Date of Patent: Jan. 24, 2006

(54) BOUNDARY SCAN REGISTER FOR DIFFERENTIAL CHIP CORE

(75) Inventors: Navaz M. Lulla, Fremont, CA (US); Ramin Ighani, Santa Clara, CA (US); Roger J. Bettman, Los Altos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 444 days.

(21) Appl. No.: 10/309,664

(22) Filed: Dec. 3, 2002

(51) Int. Cl.
*G01R 31/28* (2006.01)

(52) U.S. Cl. .................................................. 714/727
(58) Field of Classification Search ................ 714/724, 714/726, 727, 729; 324/763, 765
See application file for complete search history.

(56) References Cited

U.S. PATENT DOCUMENTS

| | | | |
|---|---|---|---|
| 5,379,302 A | 1/1995 | Andrews | |
| 5,418,470 A | 5/1995 | Dagostino et al. | |
| 5,428,626 A | 6/1995 | Frisch et al. | |
| 5,498,972 A | 3/1996 | Haulin | |
| 5,644,261 A | 7/1997 | Frisch et al. | |
| 5,670,890 A | 9/1997 | Colwell et al. | |
| 5,787,094 A | 7/1998 | Cecchi et al. | |
| 5,870,410 A | 2/1999 | Norman et al. | |
| 5,996,102 A * | 11/1999 | Haulin | 714/740 |
| 6,269,462 B1 | 7/2001 | Shimizu et al. | |
| 6,426,649 B1 | 7/2002 | Fu et al. | |

OTHER PUBLICATIONS

Intellitech Scan Tools, JTAG & other IEEE Standards information. Webpage [online]. 2000 Intellitech Corporation [retrieved on Sep. 14, 2002]; retrieved from the internet: <URL:http://www.intellitech.com/resources/IEEEstandard-sandjtag.html.

BSD Compiler boundary scan synthesis, SYNOPSYS, Inc. 1999.

JTAG (IEEE 1149.1/P1149.4) Tutorial Introductory; 1997 TI Test Symposium.

* cited by examiner

*Primary Examiner*—Albert Decady
*Assistant Examiner*—James C. Kerveros
(74) *Attorney, Agent, or Firm*—Okamoto & Benedicto LLP

(57) ABSTRACT

An integrated circuit including a first cell configured to perform boundary scan testing, and an I/O node coupled to the first cell, wherein the I/O node is configured to carry a first differential signal. A level translator may be coupled between the I/O node and the first cell, wherein the level translator is configured to translate the first differential signal into a single ended signal. A level translator may be coupled between the I/O node and the first cell, wherein the level translator is configured to translate a single ended signal into the first differential signal. Core logic may be coupled to the first cell, wherein the core logic is configured to process a second differential signal, and a level translator may be coupled between the core logic and the first cell, wherein the level translator is configured to translate the second differential signal into a single ended signal.

17 Claims, 8 Drawing Sheets

BOUNDARY SCAN REGISTER FOR DIFFERENTIAL CHIP CORE

BACKGROUND OF THE INVENTION

1. Field of the Invention

The present invention relates generally to integrated circuit testing, and more particularly to boundary scan testing of integrated circuits.

2. Description of the Background Art

The use of boundary scan testing of integrated circuits ("ICs") is well known (an IC for purposes of this disclosure includes an ASIC and any other similar semiconductor device). Industry standards for boundary scan testing have been promulgated by IEEE as 1149.1 Standard Test Access Port and Boundary Scan Architecture, also known as JTAG in the United States. Information on the IEEE 1149.1 is available over the Web at, among other sources, http://www.ti.com and www.jtag.com.

Numerous commercial applications are available which automate the design of JTAG-compliant test port and scan logic architecture for a given IC design, and the subsequent testing of the fabricated IC using the JTAG-compliant scan logic. For example, BSD (Boundary-Scan Device) COMPILER, manufactured by SYNOPSIS CORPORATION of Mountain View, Calif., is a tool for automated synthesis and verification (among other things) of JTAG-compliant boundary scan logic in ICs. BSD COMPILER also automatically generates a BSDL (boundary scan description language) file describing the particular JTAG-compliant boundary scan design, which may be used for testing purposes. (BSDL is an industry standard description language for devices complying with the IEEE 1149.1.)

FIG. 1 schematically illustrates a conventional boundary scan architecture compliant with IEEE 1149.1. In FIG. 1, an IC 102 includes a single ended core logic 110, a plurality of input/output (I/O) nodes 100, and JTAG compliant boundary scan logic (dotted boxes 106 and 108). Boundary scan logic (dotted boxes 106 and 108) may be divided into boundary scan register (hereafter "scan register") 106 and control logic block 108 for purposes of this disclosure. Scan register 106 includes a plurality of boundary scan cells (hereafter "scan cells") 104 connected in series (and data flow direction) 104A–104F respectively. Each scan cell 104A–104F is coupled to an I/O node 100A–100F respectively. For purposes of this disclosure, an I/O node includes an I/O pin, an I/O pad, an I/O port, or any similar I/O interface for an IC 102. Please note that an I/O node may be bi-directional (i.e., accommodate input and output signals). JTAG-compliant control logic block 108 includes a bypass register 114, an instruction register 116, optional data register 118, TAP (Test Access Port) controller 120, and other logic omitted for purposes of ease of description. Control lines from control logic block 108 to each of the scan cells 104 are also omitted to facilitate description.

In operation, each scan cell 104 operates generally in two modes: scan test mode and normal mode. In scan test mode, scan cells 104 typically perform one of the following: capture data from input nodes 100A–100C, drive data to output nodes 100D–100F, scan in test data carried on TDI signal 110 into scan register 106 from input I/O node 10G, or scan out test data carried on TDO signal 112 to output I/O node 100H. In normal mode, input data signals 103A–103C are received from input I/O nodes 100A–100C and passed directly through scan cells 104A–104C without additional processing (e.g., capturing) by the scan cells 104A–104C; input data signals 103D–103F are likewise received from single ended core logic 110 and passed directly through scan cells 104D–104F without processing (e.g., capturing) by the scan cells 104D–104F. Scan cell 104 functions are controlled by control logic block 108. In particular, in JTAG-compatible control logic blocks, TAP controller 120 receives test mode select ("TMS") signals 122 via I/O node 100J, which—in combination with instruction register 116, bypass register 114, and optional data register 118—control operation of scan register 106. TAP controller 120 typically receives TMS signals 122 from commercially available JTAG design and testing applications operating on a test computer system (shown as 204 in the FIG. 2). JTAG compliant boundary scan logic (dotted boxes 1.06 and 108) operates synchronously with test clock signal ("TCK") 124 received via I/O node 1001.

FIG. 2 schematically illustrates a common use of JTAG boundary scan logic to test the interconnecting nets (open/short) of a printed circuit board ("PCB"), referred to also as a "board-level test." In FIG. 2, PCB 202 includes multiple JTAG-compliant ICs 102-1 to 102-n connected in series for performing a board-level test. The scan registers 106 for each IC 102 are connected in series to form a single longer scan register consisting of the individually connected scan registers 106. In particular, TDO output nodes, e.g., 100H-1 to 100H-2, of each scan register 102 in the series, are connected to the TDI input nodes, e.g., 100G-2 to 100G-n, of the next scan register in the series. The TDO output node 100H-n of the last scan register 102-n in the series, and the TDI input node of the 100G-1 first scan register 106-1 in the series, are then connected to a TAP control device 204 via a test connector 206. It should be noted that not all of the ICs 102 on the PCB 202 need to be interconnected to perform board-level testing, as testing only a portion of a PCB may be desirable. TAP control device 204 is typically a computer system running a commercially available JTAG design and testing application. Connecting the IC-specific scan registers 106 into a single large scan register enables scan test data stored on TAP control device 204 to be scanned into and scanned out of the scan registers 106 by the TAP control device 204 for testing purposes.

The I/O nodes 100A to 100F of each IC 102 (reference numerals for each I/O node in FIG. 2 are not shown to avoid clutter) are interconnected according to the particular design requirements of the PCB 202, thereby defining the board-level nets to be tested. In FIG. 2, the output I/O nodes of each IC 102 in the series are connected to the corresponding input I/O nodes of the next IC 102 in the series, although an output I/O node may be connected to one or more input I/O nodes of any IC 102 on a PCB depending on the design requirements of the PCB. Accordingly, for example, output I/O node 100E-1 in IC 102-1 is connected to input I/O node 100B-2 in IC 102-2, thereby forming net 208. Boundary scan testing enables the integrity of net 208 to be tested by, for example, scanning in test data into scan cell 104E-1, driving a signal carrying the test data across net 208, capturing the signal in scan cell 104B-2, and then scanning out the captured data from scan cell 104B-2 back to the TAP control device 204 for analysis. In this manner, the integrity of net 208, and all of the nets generally included in PCB 202, may be determined by TAP control device 204 in a cost-efficient manner. Other types of testing (besides board-level testing) are available using boundary scan logic, such as functional testing of the IC and PCB (e.g., JTAG intest instruction), among other possibilities.

SUMMARY

An integrated circuit comprising a first cell configured to perform boundary scan testing, and an I/O node coupled to the first cell, wherein the I/O node is configured to carry a first differential signal is disclosed. A level translator may be coupled between the I/O node and the first cell, wherein the level translator is configured to translate the first differential signal into a single ended signal. A level translator may be coupled between the I/O node and the first cell, wherein the level translator is configured to translate a single ended signal into the first differential signal. Core logic may be coupled to the first cell, wherein the core logic is configured to process a second differential signal, and a level translator may be coupled between the core logic and the first cell, wherein the level translator is configured to translate the second differential signal into a single ended signal. Core logic may be coupled to the first cell, wherein the core logic is configured to process a-second differential signal, and a level translator may be coupled between the core logic and the first cell, wherein the level translator is configured to translate a single ended signal into the second differential signal.

These and other features and advantages of the present invention will be readily apparent to persons of ordinary skill in the art upon reading the entirety of this disclosure, which includes the accompanying drawings and claims.

The use of the same reference label in different drawings indicates the same or like components. Unless otherwise noted, the figures are not drawn to scale.

DETAILED DESCRIPTION

In the present disclosure, numerous specific details are provided, such as examples of apparatus, components, and methods to provide a thorough understanding of embodiments of the invention. Persons of ordinary skill in the art will recognize, however, that the invention can be practiced without one or more of the specific details, or with other apparatus, components, and processes. In some instances, well-known details are not shown or described to avoid obscuring aspects of the invention.

An increasingly important limitation with prevailing boundary scan architectures—and with Standard IEEE 1149.1—is their inability to accommodate mixed signal I/O with a differential core logic. For purposes of this disclosure, mixed signal I/O refers to an IC which accommodates single-ended and differential signals in its I/O and core logic. For purposes of this disclosure, a differential core logic refers to a IC core logic that accommodates single ended and differential signals. The inability of existing boundary scan architectures to accommodate mixed signal I/O with a differential core logic is increasingly problematic, for example, in the area of communication chip manufacturing and communication systems design where the use of such logic is increasing prevalent. For the communications system designer, testing problems arise because standard JTAG testing systems for efficient board-, chip-, and system-level testing are in widespread use. Communication chip buyers therefore desire JTAG compatible chips to take advantage of their existing JTAG testing systems. For the chip maker, problems arise because a standard specification for mixed signal scan logic is unavailable (such as a JTAG specification). Disclosed herein therefore are varying embodiments of a scan register that accommodates mixed-signal I/O with a differential core logic. These embodiments may be used with commercially available JTAG testing applications. It should be noted however that while the varying embodiments of the mixed signal boundary scan architecture for a differential core disclosed herein are described in the context of JTAG standards, they are not to be limited in use or structure to requirements imposed by IEEE 1149.1 or any other standardizations applied to boundary scan testing. The present invention may be used for boundary scan testing in general.

Figure 1:
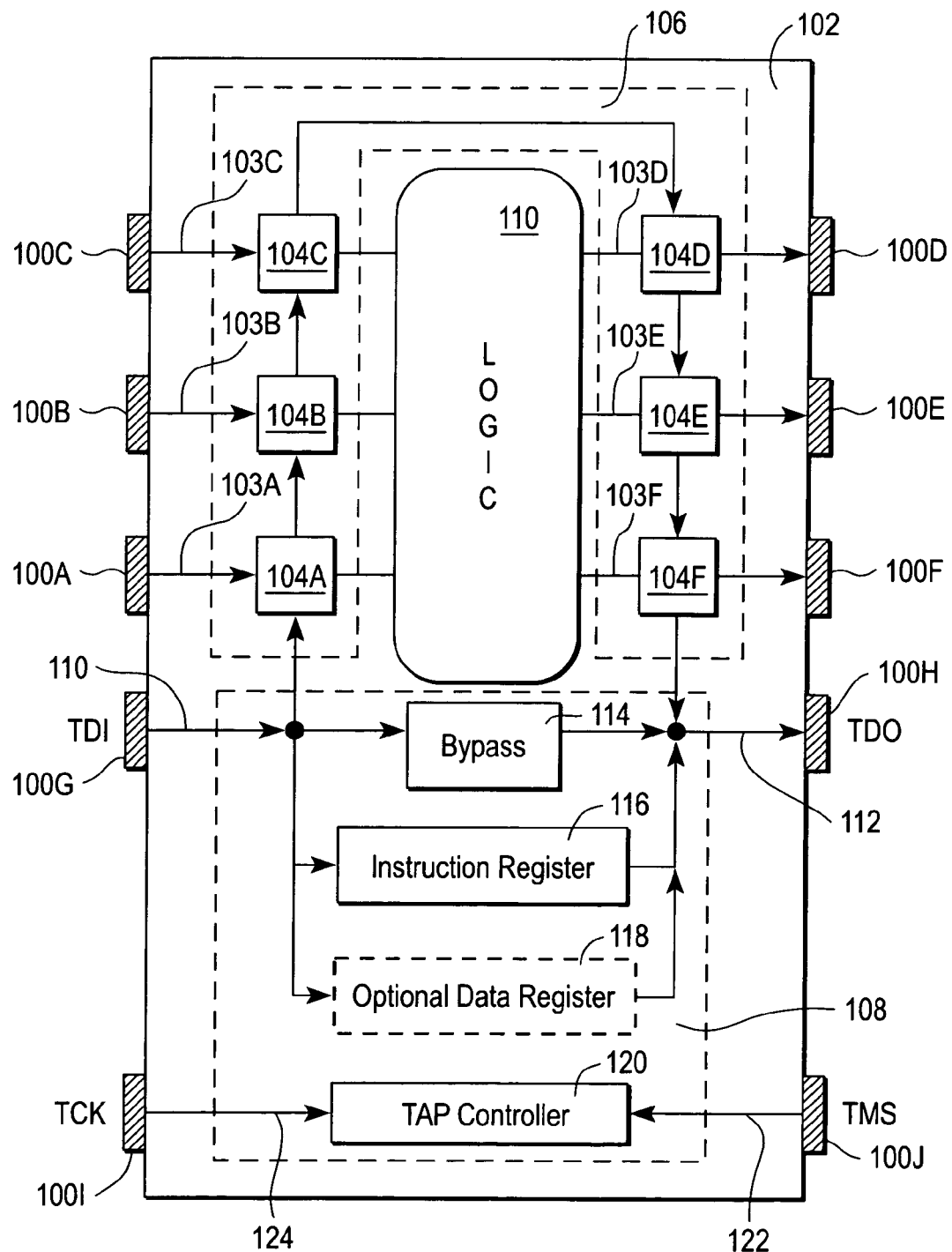
FIG. 1 schematically illustrates a conventional boundary scan architecture compliant with IEEE 1149.1.
Figure 2:
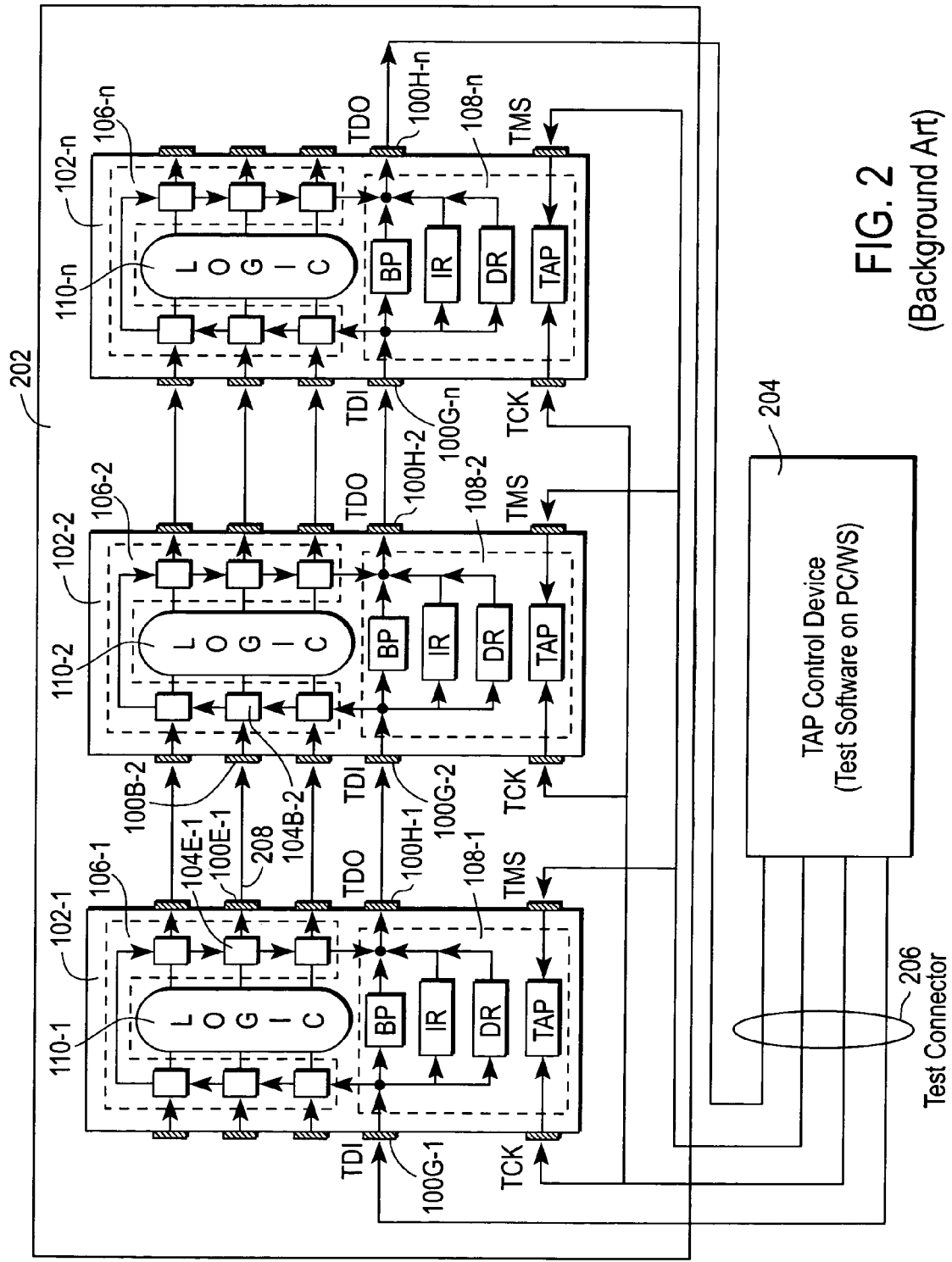
FIG. 2 schematically illustrates a common use of JTAG boundary scan logic to test the interconnecting nets of a printed circuit board.
Figure 3:
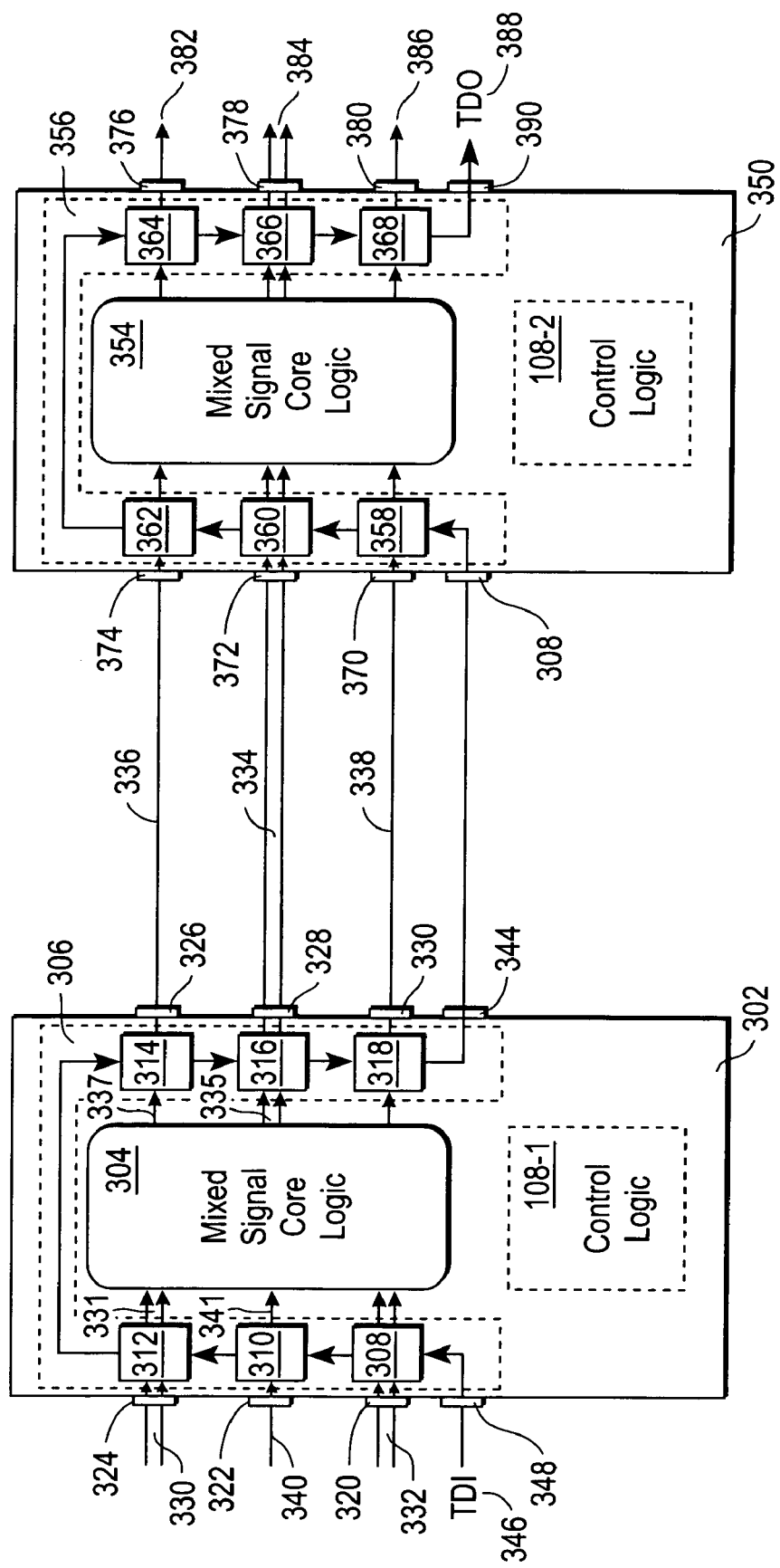
FIG. 3 schematically illustrates a series of two mixed signal ICs having mixed signal scan registers respectively, according to some embodiments of the present invention.

FIG. 3 schematically illustrates a series of two mixed signal ICs 302 and 350 having mixed signal scan registers 306 and 356 respectively, according to some embodiments of the present invention. IC 302 includes mixed signal scan register 306, differential core logic 304 (configured to process both single ended and differential signals), single ended I/O nodes 322, 326 and 330, differential I/O nodes 320, 324 and 328, and conventional single-ended JTAG-compliant control logic block 108-1. (Please note that the elements and connections in conventional JTAG control logic block 108 are omitted to facilitate description.) Mixed signal scan register 306 includes scan cells 308, 312, and 316 for accommodating differential signals 332, 330 and 334 respectively, and scan cells 310, 314 and 318 for accommodating single ended signals 340, 336 and 338 respectively. Please note that differential signals are depicted in the figures accompanying this disclosure as two parallel wires, in contrast to single ended signals which are depicted as a single wire.

IC 350 includes similar components to IC 302 with the exception of the placement of differential and single ended I/O nodes and corresponding scan cells. Accordingly, IC 350 includes mixed signal scan register 356, differential core logic 354 (configured to process both single ended and differential signals), single ended I/O nodes 370, 374–376 and 380, differential I/O nodes 372 and 378, and, in some embodiments, conventional single-ended JTAG-compliant control logic block 108-2. Mixed signal scan register 356 includes scan cells 360 and 366 for accommodating differential data signals 334 and 384 respectively, and scan cells 358, 362–364, and 368 for accommodating single ended data signals 338, 336, 382 and 386 respectively. It should be noted that control lines from, in some embodiments, conventional control logic blocks 108-1 and 108-2 to scan cells 308–318 and 358–368 respectively are omitted to facilitate description.

In FIG. 3, IC 302 is connected to IC 350 via I/O nodes 326–330 (IC 302) and 370–374 (IC 350). In particular, single ended I/O node 326 is connected to corresponding single ended I/O node 374 thereby forming single ended net 336; differential output I/O node 328 is connected to corresponding differential I/O node 372 forming differential net 334; and single ended I/O node 330 is connected to corresponding single ended I/O node 370 forming single ended net 338. It should be noted that an output I/O node may be connected to one or more input I/O nodes on IC 350 or another IC (not shown), and that generally a differential or single ended output I/O node is connected to one or more corresponding differential or single ended input I/O nodes respectively (unless a signal undergoes translation between I/O nodes of differing signal type). Scan registers 306 and 356 are connected to form a single longer scan register via connecting TDO output node 344 to TDI node 388; the longer scan register includes scan cells 308–318 and 358–368. Scan registers 306 and 356 may be controlled by JTAG-compatible control logic blocks 108-1 and 108-2 under direction of a TAP control device (not shown) operating in a conventional manner. Therefore, in accordance with some embodiments of the present invention, input test data may be shifted into scan register 306 and 354 on TDI signal 346 received from TDI input node 348, and output test data may be scanned out on TDO signal 388 via TDO output node 390.

When scan cells 308–318 and 358–368 are instructed to operate in normal mode, both single ended and differential signals entering scan cells pass directly through the scan cells. Thus, for example, differential signal 330 and single ended signal 340 received from another IC (not shown) on the PCB board pass directly through scan cells 312 and 310 respectively, to be received by differential core logic 304 as differential signal 331 and single ended signal 341 respectively (I/O nodes 324 and 322 are ignored here to simplify explanation). Likewise, single ended signal 337 and differential signal 335 from differential core logic 304 are passed directly through scan cells 314 and 316 as single ended signal 336 and differential signal 334 respectively (I/O nodes 326 and 328 are ignored here for simplicity). In this manner, scan register 306 and 356 may be alternatively instructed to perform scan tests, such as board-level testing of mixed signal nets 334–338, including both differential net 334 and single ended nets 336 and 338, and testing of differential core logic 304 and 354, as well operate in normal mode. In normal mode, scan registers 306 and 356 behave transparently to normal transmission of data signals between ICs 302 and 350, and between ICs 302 and 350 and other components on the PCB board (not shown).

Figure 4:
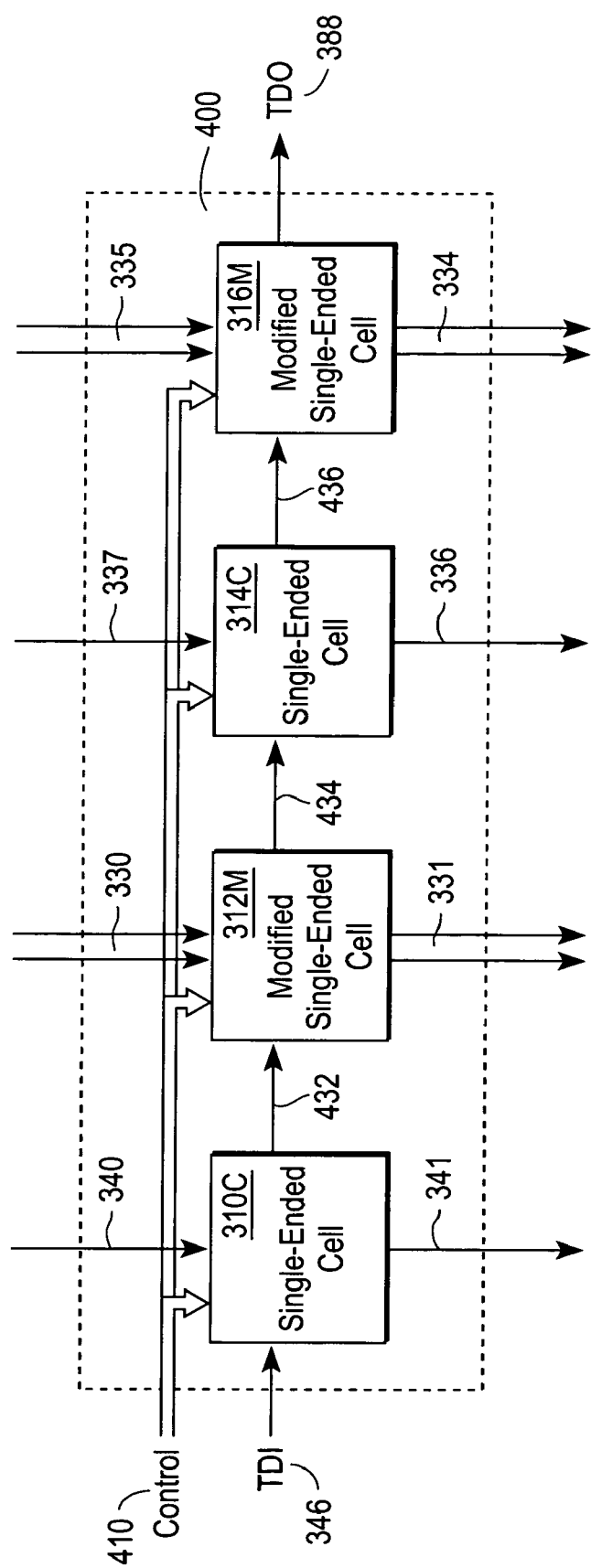
FIG. 4 illustrates in more detail a portion of the mixed signal scan register of FIG. 3 implemented with conventional single ended cells and modified single ended cells, according to some embodiments of the present invention.

FIG. 4 illustrates in more detail a portion of mixed signal scan register 306 implemented with conventional single ended cells and modified single ended cells, according to some embodiments of the present invention. For purposes of this disclosure, a single ended scan cell, hereafter "single ended cell," refers to a scan cell configured with a single ended storage element, such as a conventional scan cell or a modified single ended cell described in reference to FIG. 5. As illustrated in FIG. 4, a portion 400 of mixed signal scan register 306 comprising scan cells 310–316 is implemented with conventional single-ended cell 310C, modified scan cell 312M, conventional single-ended cell 314C, and modified single-ended cell 316M. Conventional single ended cells 310C and 314C are used for testing single ended data signals 340 and 330 respectively, and the modified single ended cells 312M and 316M are used for testing differential signals 337 and 335 respectively. Conventional single ended cell 310C and modified single-ended cell 312M may receive input data signals 340 and 330 from other ICs on the PCB (not shown), and present output data signals 341 and 331 respectively to differential core logic 304. Conventional single ended cell 314C and modified single-ended cell 316M receive input data signals 337 and 335 from differential core logic 304, and present output data signals 336 and 334 respectively to IC 350 (this ignores the intervening I/O nodes to simplify explanation). Control lines 410 connecting each scan cell 402–408 to control logic block (not shown) are single ended, and TDI/TDO (SIN/SOUT) signals 346, 432–436, and 388 for shifting scan test data through the scan register portion 400 are single ended.

Figure 5:
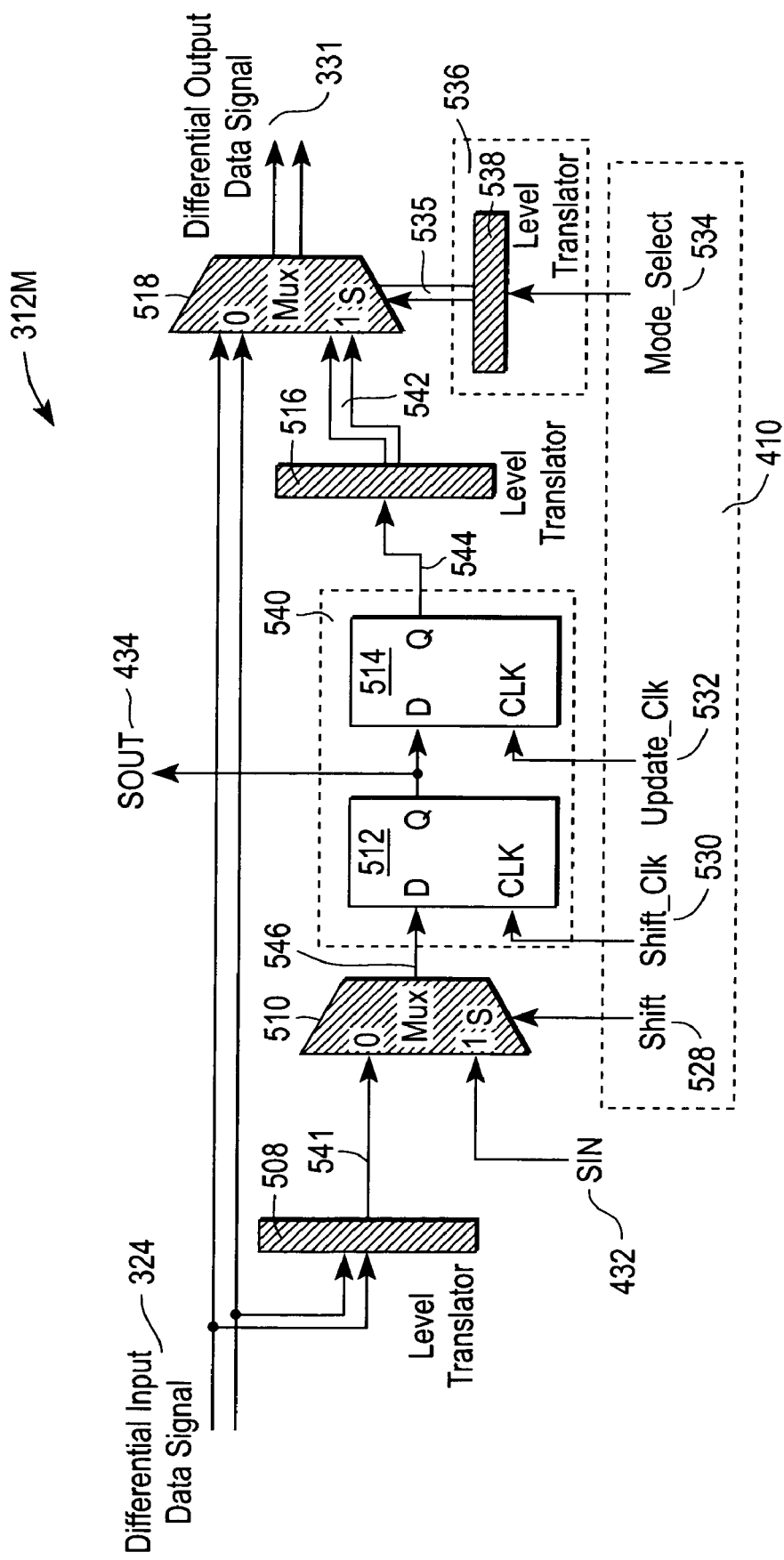
FIG. 5 schematically illustrates a modified single ended cell in FIG. 4, according to some embodiments of the present invention.

FIG. 5 schematically illustrates modified single ended cell 312M in FIG. 4, configured to accommodate a differential input data signal, according to some embodiments of the present invention. In FIG. 5, modified single ended cell 312M includes a single ended memory element 540, a single ended multiplexer 510, a differential multiplexer 518, and three level translators 508, 516 and 538. (Please note that differential components in the figures accompanying this disclosure are depicted with diagonal filler lines, in contrast to single ended components which are depicted without filler visuals; in addition, the level translators throughout this disclosure are depicted with grey filler.) Single ended memory element 540 includes two single ended D flip-flops 512 and 514 connected in series. Modified single ended cell 312M receives differential input data signal 324 and control signals 410. Control signals 410 include differential Mode_Select signal 535, and multiple single ended signals, including Shift signal 528, Shift_Clk signal 530, and Update_Clk signal 532. Modified single ended cell 312M outputs single ended scan out data signal ("SOUT") 434, and differential output data signal 331.

In operation, modified single ended cell 312M may receive differential input data signal 324 from another IC on the PCB (not shown). Differential multiplexer 518 determines whether modified singled ended cell 312M operates in test mode or normal mode. Differential multiplexer 518 receives differential data input signal 324 and differential signal 542. In normal mode, differential multiplexer 518 is configured to receive differential input data signal 324, and directly present it as differential output data signal 0.331 to differential signal core logic 304. In test mode, differential multiplexer 518 receives differential signal 542 (typically representing a test value shifted into single ended storage element 540) and presents it as differential output signal 331. Differential signal 542 is translated by level translator 516 from single ended signal 544 presented by single ended storage element 540. Differential multiplexer 518 is controlled by differential signal 535, which is translated by level translator 538 from single ended Mode_Select signal 534 presented by conventional JTAG control logic block (not shown). It should be noted that only a single level translator 538 generally may be needed to translate single ended Mode_Select signal 534 for all of the modified single ended cells in a mixed signal scan register. Thus, level translator 538 is best conceptualized as an element external to modified single ended cell 312M (illustrated by dotted box 536).

Single ended multiplexer 510 determines whether modified single ended cell 312M operates in capture mode or shift mode. In capture mode, single ended multiplexer 510 receives single ended signal 541, which is translated from differential input data signal 506 by level translator 508.

Single ended multiplexer 510 then presents single ended signal 546 (carrying the data captured from differential input signal 324) to storage element 540 for storing. In shift mode, single ended multiplexer 510 receives single ended SIN signal 432 from conventional single ended scan cell 310C. In shift mode, single ended multiplexer 510 presents single ended signal 546 (carrying the data received from SIN signal 432) to storage element 540 for storing. Single ended multiplexer 510 is controlled by single ended Shift signal 528.

Storage element 540 includes a first D flip-flop 512 connected in series to a second D flip-flop 514. D flip-flops 512 and 514 are driven by single ended Shift_Clk signal 530 and Update_Clk signal 532. Shift signal 528, Shift_Clk signal 530, and Update_Clk signal 532 may be driven by conventional JTAG control logic block in some embodiments compatible with the present invention. Shift_Clk signal 530 clocks a single bit of data carried by single ended signal 546 (presented by multiplexer 510) into first D flip-flop 512. First D flip-flop 512 presents this data bit to the second D flip-flop 514, and to conventional single ended cell 314C. By appropriately setting multiplexer 510 using Shift signal 528 to receive SIN signal 432, and then clocking the first D flip-flop 572 using Shift_Clk signal 530, scan test data may be shifted into the first D flip-flop 512. Appropriately setting all multiplexers using the respective Shift signals for each scan cell in the scan register, and clocking the first D flip-flop in each respective scan cell, enables scan test data to be serially shifted into and out of the scan register. Single ended Update_Clk signal 532 clocks the bit of data presented by the first D flip-flop 512 into the second D flip-flop 514. The bit of data stored in the second D flip-flop 514 may then ultimately be driven to an output I/O node (not shown) or to the differential core logic (not shown) via level translator 516 and differential multiplexer 518.

The architecture for modified single ended cell 312M is particularly advantageous for IC manufacturers using commercial boundary scan design applications such as the BSD COMPILER from Synopsis. BSD COMPILER, for example, is designed to automatically generate JTAG compliant single ended scan logic for a given IC design in a BSDL file, and is not currently designed to generate JTAG compliant mixed signal scan logic. However, an HDL ("hardware description language") gate level netlist file including a description of single ended scan logic may be advantageously converted to an HDL gate level netlist file describing a mixed signal scan design compatible with embodiments of the present invention using a script in connection with the BSD COMPILER. Thus, the BSD COMPILER, using an appropriate script, may be configured to generate mixed signal boundary scan logic compatible with some embodiments of the present invention, thereby facilitating the design of mixed signal scan logic compatible with JTAG testing standards.

Those skilled in the art will recognize that many variations to the above architecture lying within the scope of the present invention will achieve a similar functionality. For example, D flip-flops 512 and 514 may be replaced with latches or other similar state holding elements. In addition, a simplified architecture may be implemented for performing board-level net testing. For example, scan cells receiving input I/O signals arriving from the PCB (not from the differential core logic), may omit differential multiplexer 518, level translator 516 and 538, and/or flip-flop 514; and scan cells driving output I/O signals to the PCB (not to the differential core) may omit level translator 508, multiplexer 510, and/or flip-flop 514. In essence, this approach places a level translator on the input and output data signals of a conventional single ended scan cell in order for the latter to accommodate a differential signal. A drawback with this approach is that differential data signals passing through the scan cell operating in normal mode incur an additional propagation delay equal to the delays associated with each level translator. In addition, minimal board-level testing, for example, may be performed in some embodiments of the present invention using a single memory element, such as a single D flip-flop, and omitting multiplexer 510. These embodiments will prevent scan cells from capturing data on input data signals received from input I/O nodes or from differential core logic, but will enable test data to be scanned into scan registers for conducting board-level testing (i.e., open/short testing of PCB nets).

Figure 6A:
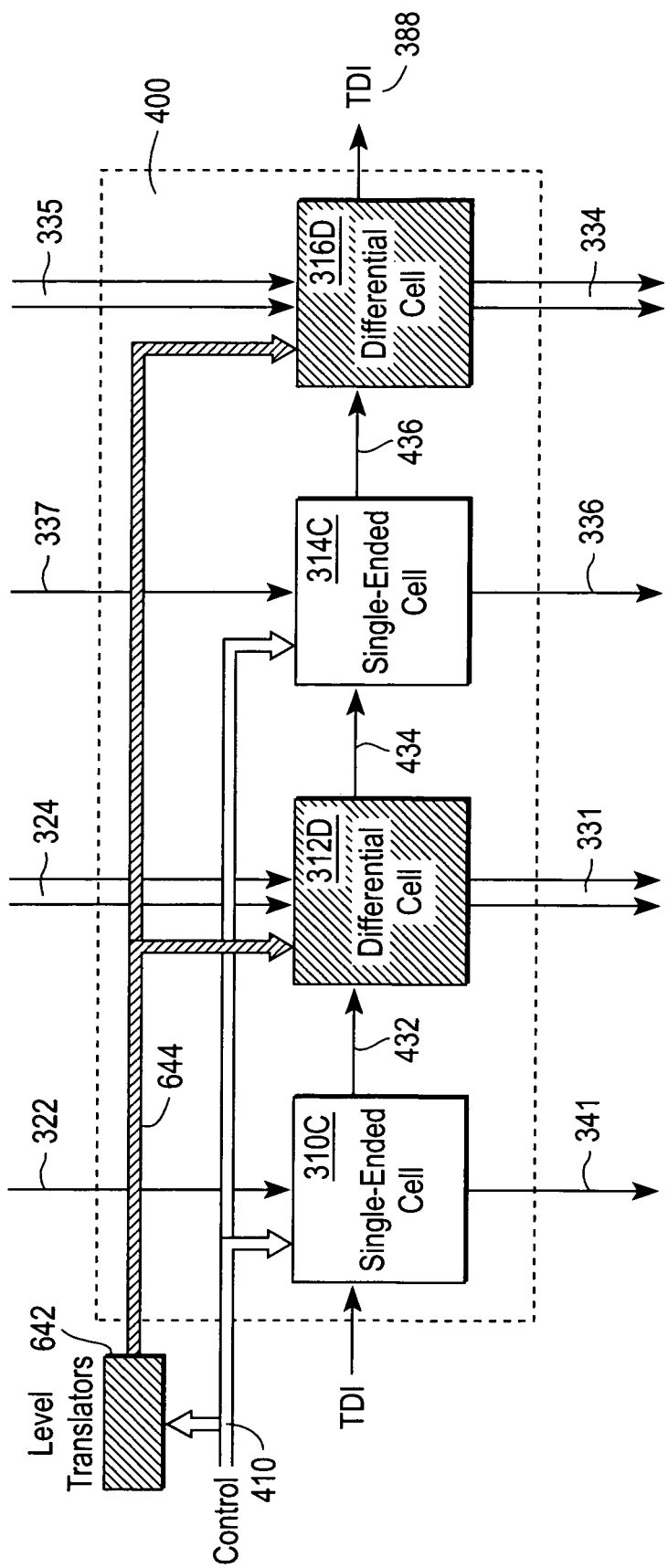
FIGS. 6A–6B schematically illustrate a second architecture for a mixed signal scan register using differential scan cells, according to some embodiments of the present invention.
Figure 6B:
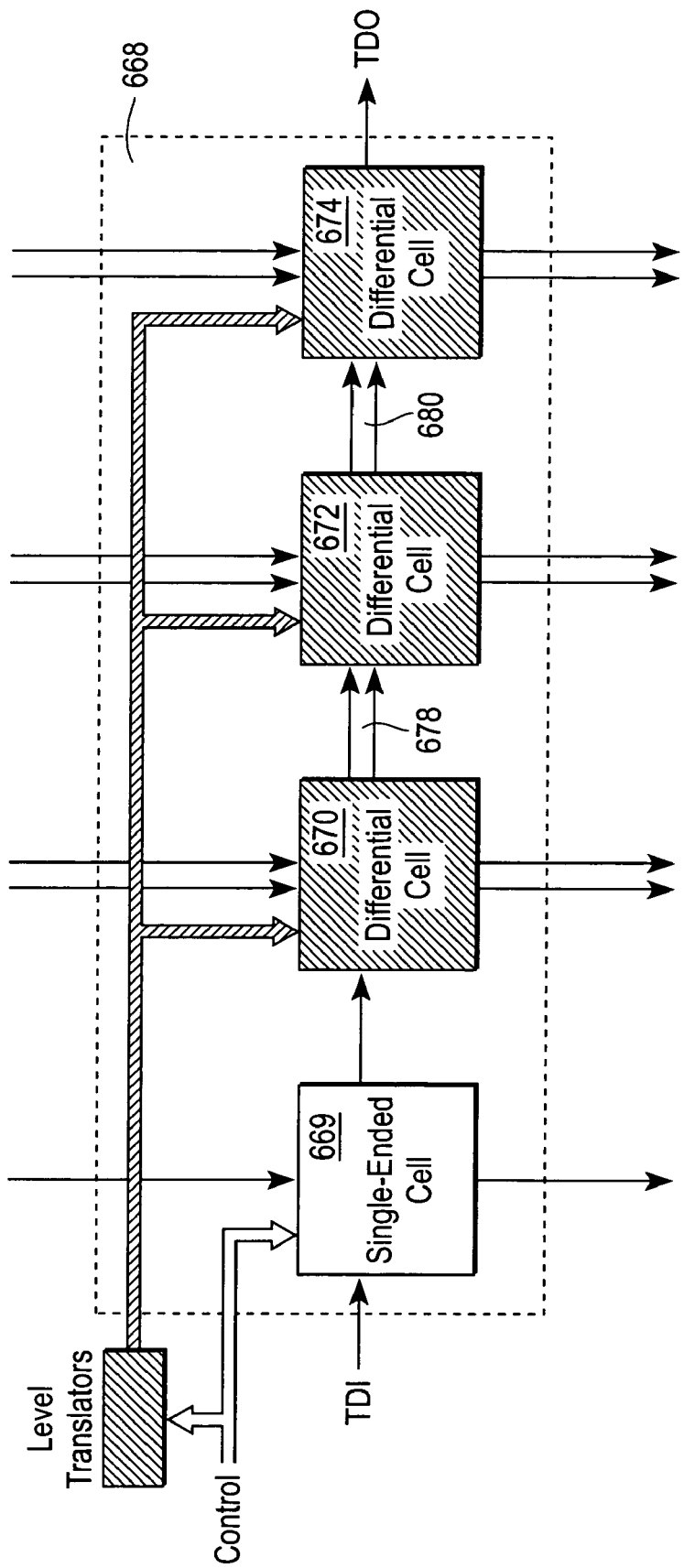

FIGS. 6A–6B schematically illustrate a second architecture for a mixed signal scan register using differential scan cells (hereafter "differential cells"), according to some embodiments of the present invention. This architecture uses a differential cell, instead of a modified single ended cell, for accommodating a differential input/output data signal.

FIG. 6A schematically illustrates a portion 400 of mixed signal scan register 306 implemented with conventional single ended cells and differential cells, according to some embodiments of the present invention. In FIG. 6A, portion 400 of mixed signal scan register 306 includes conventional single ended cells 310C and 314C, and differential cells 312D and 316D, connected in alternating order, i.e., in order 310C, 312D, 314C, and 316D respectively. Single ended cells 310C and 314C receive input data carried on single ended input data signals 322 and 337 respectively, and transmit output data on single ended output data signals 341 and 336 respectively. Differential cells 312D and 316D receive input data carried on differential input data signals 324 and 335 respectively, and transmit output data on differential output data signals 331 and 334 respectively. Conventional single ended cell 310C and differential cell 312D receive input data signals 322 and 324 from another IC on the PCB (not shown), and single ended cell 314C and differential cell 316D receive input data signals 337 and 335 from differential core logic 304. Conventional single ended cell 310C and differential cell 312D transmit output data signals 341 and 331 to differential core logic 304, and single ended cell 314C and differential cell 316D transmit output data signals 336 and 334 to IC 350.

Conventional single ended cells 310C and 314C are controlled by single ended control lines 410. Single ended control lines 410 may be driven by conventional JTAG control logic block. Differential cells 312D and 316D are controlled by differential control lines 644 connected to one or more level translators 642. Level translators 642 are configured to translate single ended control signals 410 to differential control signals 644. Test data is carried between adjacent single ended cells on single ended signals (not shown), and between adjacent single ended cells, e.g., 310C, and differential cells, e.g., 312D, also on single ended signals, e.g., 452.

FIG. 6B schematically illustrates a portion 668 of a mixed signal scan register similar to mixed signal scan register portion 400 of FIG. 6A, according to some embodiments of the present invention. The difference between the mixed signal scan register portions 668 and 400 is that portion 668 includes multiple differential cells 670–674 connected in series, thereby illustrating that scan test data is carried between differential cells, e.g., 670–674, using differential signals, e.g., 678 and 680. It should be noted that the embodiments of the present invention illustrated in FIGS. 6A–6B generally enable any number of single ended cells (for processing single ended data signals), for example a conventional single ended cell, to be connected to any number of differential cells (for processing differential data signals) in any order.

Figure 7:
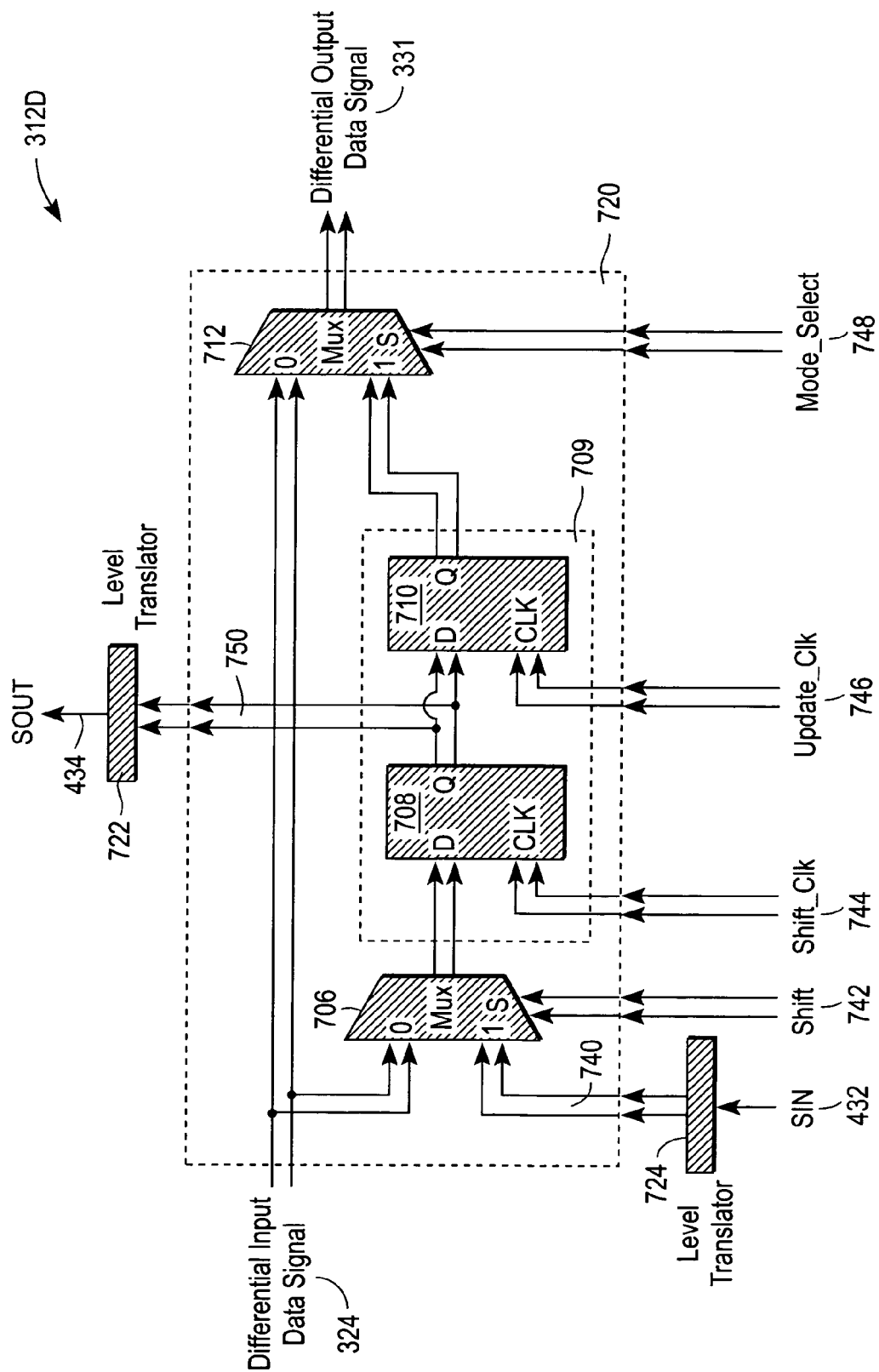
FIG. 7 schematically illustrates an architecture for a differential cell in FIG. 6A, according to some embodiments of the present invention.

FIG. 7 schematically illustrates an architecture for differential cell 312D in FIG. 6A, according to some embodiments of the present invention. Differential cell 312D includes differential logic block 720, and level translators 724 and 722. The components and signals in differential logic block 720 are differential, and therefore will not be specifically referred to as "differential" to improve readability. Logic block 720 includes multiplexers 706 and 712, and D flip-flops 708–710 connected in series. Control signals 742–748 control processing of logic block 720, and are received from one or more level translators 642 (FIG. 6A).

In operation, logic element functionalities and signals comprising logic block 720 operate similarly to modified single ended cell 312M, except that logic block 720 uses differential signals and differential components. Accordingly, level translators (e.g., 508 and 516) for performing signal translation within the logic block 720 are omitted because they are superfluous. However, because differential cell 604 includes a differential storage element 709, and because differential cell 604 may be positioned in a mixed signal scan register adjacent to a single ended cell with a single ended storage element (e.g., differential cell 312D positioned adjacent to single ended cells 310C and 314C in mixed signal scan register portion 400 (FIG. 6A)), signals carrying test data between scan cells may require signal translation traveling from a differential cell to a single ended cell, and from a single ended cell to a differential cell. Accordingly, in differential cell 312D (FIG. 6A), level translators 724 and 722 translate single ended SIN signal 432 and differential signal 750. Level translator 724 receives single ended scan test data signal 432 (FIG. 6A) from single ended cell 310C, and translates it to differential signal 740 for presentation to differential multiplexer 706. Level translator 722 likewise receives differential SOUT signal 750, and translates it to single ended SOUT signal 434 for presentation to single ended cell 314C.

As can be appreciated by those skilled in the art, depending on whether one or more single ended cells are positioned adjacent to a differential cell, one or more level translators, e.g., 722–744, in a differential cell may be used to translate scan test data input/output signals. In particular, a level translator may be required to translate a single ended scan test data input signal (SIN signal) to a differential signal when a single ended cell is positioned before a differential cell in a scan register, and a level translator may be required to translate a differential scan test data output signal (SOUT signal) to a single ended signal when a single ended cell is positioned after a differential cell in a scan register. In addition, no level translators are generally needed for signal translation of scan data signals between two single ended cells (scan data is carried on single ended signals), or between two differential cells (scan data is carried on differential signals, e.g., 678).

Those skilled in the art will recognize that many variations to differential cell 312D described in reference to FIG. 7 will achieve a similar functionality. For example, differential D flip-flops 512 and 514 may be replaced by differential latches or other similar state holding elements. In addition, a simplified architecture may be implemented for performing board-level net testing. For example, differential scan cells receiving input I/O signals arriving from the PCB (not from the differential core logic), may omit differential multiplexer 712 and/or differential flip-flop 710; and differential scan cells driving output I/O signals to the PCB (not to the differential core) may omit multiplexer 706 and/or flip-flop 710. This will prevent the scan cell from capturing data from input signals received from input I/O nodes or from the differential core logic (thereby not complying with JTAG standards), but will enable test data to be scanned into scan registers for conducting board-level testing (e.g., open/short testing of PCB nets).

The above description is provided to illustrate specific embodiments of the present invention and is not intended to be limiting. Numerous variations and modifications within the scope of the present invention are possible. For example, persons of ordinary skill in the art using the teachings of the present invention may transpose the order of the disclosed processing steps, interpose insignificant steps, or substitute materials equivalent to those disclosed herein. Thus, the present invention is limited only by the following claims.

What is claimed is:

1. An integrated circuit, comprising:
a first boundary scan cell in a plurality of boundary scan cells, the plurality of boundary scan cells being configured for boundary scan testing of the integrated circuit, the first boundary scan cell being configured to receive a first input signal and output a first output signal and a second output signal, the first input signal comprising a differential signal as received by the first boundary scan cell;
a second boundary scan cell in the plurality of boundary scan cells, the second boundary scan cell being configured to receive the first output signal of the first boundary scan cell, the second boundary scan cell being configured to output a third output signal and a fourth output signal;
a third boundary scan cell in the plurality of boundary scan cells, the third boundary scan cell being configured to receive the third output signal of the second boundary scan cell, the third boundary scan cell being configured to output a fifth output signal and a sixth output signal;
a core logic configured to receive the second output signal of the first boundary scan cell, the fourth output signal of the second boundary scan cell, and the sixth output signal of the third boundary scan cell, wherein the second output signal of the first boundary scan cell comprises a differential signal as received by the core logic; and
a first input-output (I/O) node coupled to an input of the first boundary scan cell.

2. The integrated circuit of claim 1, further comprising:
a level translator coupled between the first I/O node and the first boundary scan cell, wherein the level translator is configured to translate the first input signal from single ended to differential before being received by the first boundary scan cell.

3. The integrated circuit of claim 1, further comprising:
a level translator coupled between the first boundary scan cell and the core logic, wherein the level translator is configured to translate the second output signal from single ended to differential before being received by the core logic.

4. The integrated circuit of claim 1, further comprising:
a level translator coupled between the first boundary scan cell and the second boundary scan cell, wherein the level translator is configured to translate the first output signal of the first boundary scan cell from single ended to differential before being received by the second boundary scan cell.

5. The integrated circuit of claim 1 wherein the second boundary scan cell comprises a single ended boundary scan cell configured to receive a single ended signal from a second input-output node.

6. The integrated circuit of claim 1 wherein the third boundary scan cell comprises a single ended boundary scan cell and configured to output the sixth output signal such that the sixth output signal is received by the core logic in differential form.

7. The integrated circuit of claim 1 wherein the second boundary scan cell comprises a single ended boundary scan cell and the third boundary scan cell comprises a differential boundary scan cell.

8. A method of performing boundary scan testing, the method comprising:
receiving a first differential signal in a first boundary scan cell in a plurality of boundary scan cells configured for performing boundary scan testing in a first integrated circuit, the plurality of boundary scan cells being coupled to a core logic of the first integrated circuit, the core logic of the first integrated circuit being configured to receive at least one differential signal.

9. The method of claim 8, further comprising:
receiving the first differential signal from an I/O node of the first integrated circuit.

10. The method of claim 8, further comprising:
receiving the first differential signal from the core logic of the first integrated circuit.

11. The method of claim 8, further comprising:
sending the first differential signal to the core logic of the first integrated circuit;
receiving the first differential signal in the core logic of the first integrated circuit.

12. The method of claim 8, further comprising:
sending a single ended signal from a second boundary scan cell to the first boundary scan cell, wherein the first boundary scan cell and the second boundary scan cell are in the first integrated circuit; and
translating the single ended signal into a second differential signal.

13. The method of claim 8, further comprising:
sending a second differential signal from a second boundary scan cell to the first boundary scan cell, wherein the first boundary scan cell and the second boundary scan cell are in the first integrated circuit; and
translating the second differential signal into a single ended signal.

14. An integrated circuit, comprising:
means for receiving a first differential signal in a first boundary scan cell in a plurality of boundary scan cells configured for performing boundary scan testing in a first integrated circuit, the plurality of boundary scan cells being coupled to a core logic of the first integrated circuit, the core logic of the first integrated circuit being configured to receive at least one differential signal.

15. The integrated circuit of claim 14, further comprising:
means for translating the first differential signal into a single ended signal;
means for storing the value of the single ended signal; and
means for translating the stored value into a second differential signal.

16. The integrated circuit of claim 14, further comprising:
means for sending a single ended signal from a second boundary scan cell to the first boundary scan cell, wherein the the second boundary scan cell comprises a boundary scan cell in the plurality of boundary scan cells; and
means for translating the single ended signal into a second differential signal.

17. The integrated circuit of claim 14, further comprising:
means for sending a second differential signal from a second boundary scan cell to the first boundary scan cell, wherein the second boundary scan cell comprises a boundary scan cell in the plurality of boundary scan cells; and
means for translating the second differential signal into a single ended signal.

* * * * *